(12) United States Patent
Hashizume et al.

(10) Patent No.: US 10,596,782 B2
(45) Date of Patent: Mar. 24, 2020

(54) SUBSTRATE FOR PRINTED CIRCUIT BOARD AND PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Kayo Hashizume, Osaka (JP); Yoshio Oka, Osaka (JP); Takashi Kasuga, Osaka (JP); Jinjoo Park, Koka (JP); Hiroshi Ueda, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 3 days.

(21) Appl. No.: 15/576,909

(22) PCT Filed: Jun. 1, 2016

(86) PCT No.: PCT/JP2016/066241
§ 371 (c)(1),
(2) Date: Nov. 27, 2017

(87) PCT Pub. No.: WO2016/194964
PCT Pub. Date: Dec. 8, 2016

(65) Prior Publication Data
US 2018/0147815 A1  May 31, 2018

(30) Foreign Application Priority Data

Jun. 4, 2015 (JP) .................................. 2015-113798

(51) Int. Cl.
*B32B 15/088* (2006.01)
*H05K 3/38* (2006.01)
(Continued)

(52) U.S. Cl.
CPC ............ *B32B 15/088* (2013.01); *B32B 15/08* (2013.01); *B32B 27/34* (2013.01); *H05K 1/0298* (2013.01);
(Continued)

(58) Field of Classification Search
CPC ....... B32B 15/08; B32B 15/088; B32B 27/34; H05K 1/0298; H05K 2201/02; H05K 3/0014; H05K 3/38
See application file for complete search history.

(56) References Cited

U.S. PATENT DOCUMENTS 3,883,946 A * 5/1975 Dale ..................... H01L 24/29
228/121
5,426,849 A * 6/1995 Kimbara ............. H01L 21/4857
156/182

(Continued)

FOREIGN PATENT DOCUMENTS

JP  2006-287217 A  10/2006
JP  2013-161928 A  8/2013

*Primary Examiner* — William H. Mayo, III
*Assistant Examiner* — Rhadames Alonzo Miller
(74) *Attorney, Agent, or Firm* — Faegre Drinker Biddle & Reath LLP

(57) ABSTRACT

A substrate for a printed circuit board according to an embodiment of the present invention includes a resin film and a metal layer stacked on at least one of surfaces of the resin film. An average diffusion depth of a main metal of the metal layer in the resin film is 100 nm or less after a weather resistance test in which the substrate is held at 150° C. for seven days. The average diffusion depth is preferably 80 nm or less before the weather resistance test.

14 Claims, 1 Drawing Sheet

(51) Int. Cl.
  *B32B 15/08* (2006.01)
  *B32B 27/34* (2006.01)
  *H05K 1/02* (2006.01)
  *H05K 3/00* (2006.01)

(52) U.S. Cl.
  CPC ............. *H05K 3/0014* (2013.01); *H05K 3/38* (2013.01); *H05K 2201/02* (2013.01)

(56) References Cited

U.S. PATENT DOCUMENTS

| | | | | |
|---|---|---|---|---|
| 6,472,080 B1* | 10/2002 | Inagaki | ...................... | C08J 7/12 427/387 |
| 6,835,241 B2* | 12/2004 | Tsuchida | .................. | C09D 4/00 106/287.14 |
| 2004/0047056 A1* | 3/2004 | Sekiguchi | .............. | C08G 61/08 359/883 |
| 2004/0057141 A1* | 3/2004 | Sekiguchi | .............. | C08G 61/08 359/883 |
| 2004/0242823 A1* | 12/2004 | Sekiguchi | .............. | C08G 61/06 526/279 |
| 2005/0272903 A1* | 12/2005 | Mitsunaga | ............. | C08K 5/521 528/196 |
| 2006/0223316 A1* | 10/2006 | Baik | .................... | H05K 3/1208 438/689 |
| 2007/0063217 A1* | 3/2007 | Brogan | ............... | H01L 21/2007 257/133 |
| 2007/0084033 A1* | 4/2007 | Ito | ........................... | B41J 2/161 29/25.35 |
| 2007/0181900 A1* | 8/2007 | Sato | ........................ | H01L 33/60 257/99 |
| 2007/0209547 A1* | 9/2007 | Irumata | ................... | C22C 19/07 106/1.12 |
| 2009/0045519 A1* | 2/2009 | Kamikubo | ........ | H01L 21/76834 257/773 |
| 2009/0214876 A1* | 8/2009 | Kano | ...................... | C23C 18/31 428/423.1 |
| 2009/0266583 A1* | 10/2009 | Nagasaki | ............. | C23C 18/2086 174/250 |
| 2010/0279012 A1* | 11/2010 | Sato | ..................... | C23C 18/1608 427/256 |
| 2011/0261443 A1* | 10/2011 | Isojima | ................. | C03C 17/002 359/360 |
| 2011/0318602 A1* | 12/2011 | Yoshida | .............. | C23C 18/1651 428/621 |
| 2012/0189859 A1* | 7/2012 | Nozaki | .................. | B32B 15/08 428/458 |
| 2012/0206891 A1* | 8/2012 | Yoshioka | .............. | H01L 21/4846 361/783 |
| 2013/0285070 A1* | 10/2013 | Kawai | ................ | H01L 21/0455 257/77 |
| 2014/0113121 A1* | 4/2014 | Kammuri | ............. | H05K 1/0393 428/217 |
| 2014/0357012 A1* | 12/2014 | Toriyama | ................ | G02B 1/12 438/71 |
| 2014/0360869 A1* | 12/2014 | Otsuki | ...................... | C22C 9/00 204/298.13 |
| 2014/0363646 A1* | 12/2014 | Hayashi | .................... | B32B 5/28 428/213 |
| 2015/0034366 A1* | 2/2015 | Yoshioka | ............... | H05K 1/111 174/251 |
| 2015/0342045 A1* | 11/2015 | Nakabayashi | ........ | G02B 6/0073 362/611 |
| 2016/0120017 A1* | 4/2016 | Momoi | ................ | H01L 23/3735 361/720 |

* cited by examiner

SUBSTRATE FOR PRINTED CIRCUIT BOARD AND PRINTED CIRCUIT BOARD

TECHNICAL FIELD

The present invention relates to a substrate for a printed circuit board and a printed circuit board.

The present application claims priority to Japanese Patent Application No. 2015-113798 filed Jun. 4, 2015, and the entire contents of the Japanese application are incorporated herein by reference.

BACKGROUND ART

Substrates for printed circuit boards are widely used, the substrates including metal layers formed of, for example, metals stacked on surfaces of insulating resin films formed of, for example, resins and being configured to provide printed circuit boards by etching the metal layers to form conductive patterns.

There has been a need for a substrate for a printed circuit board, the substrate having a high adhesive force between a resin film and a metal layer so that when a folding force is applied to a printed circuit board formed by using such a substrate for a printed circuit board, the metal layer does not peel off from the resin film.

In recent years, with the miniaturization of electronic devices, a decrease in the thicknesses of printed circuit boards has also been required. In view of this, various methods for directly stacking a metal layer on a surface of a resin film without using an adhesive have been proposed. For example, a technique has been proposed in which a metal layer is formed on a surface of a resin film by reducing a metal ion in a state where the resin film is immersed in a solution containing the metal ion (refer to Japanese Unexamined Patent Application Publication No. 2013-161928). This patent application publication discloses that, as an index of adhesiveness between a resin film and a metal layer, a peel strength between the resin film and the metal layer after a weather resistance test including holding at 150° C. for seven days should be increased.

CITATION LIST

Patent Literature

PTL 1: Japanese Unexamined Patent Application Publication No. 2013-161928

SUMMARY OF INVENTION

A substrate for a printed circuit board according to an embodiment of the present invention, which has been made to solve the problems described above, includes a resin film and a metal layer stacked on at least one of surfaces of the resin film. An average diffusion depth of a main metal of the metal layer in the resin film is 100 nm or less after a weather resistance test in which the substrate is held at 150° C. for seven days.

DESCRIPTION OF EMBODIMENTS

Technical Problem

Figure 1:
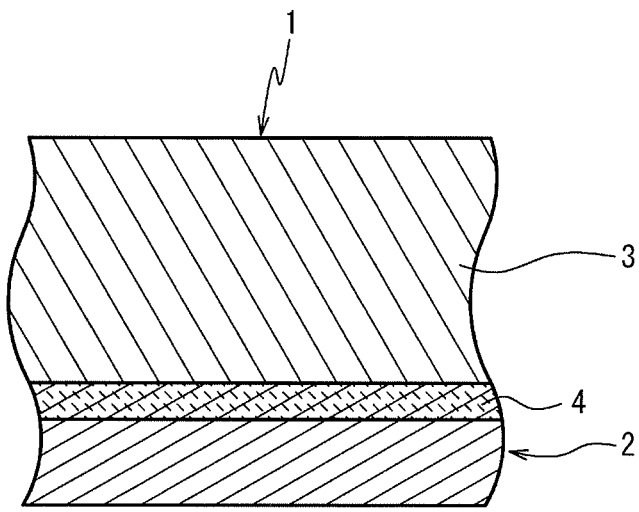
FIG. 1 is a schematic sectional view illustrating a substrate for a printed circuit board according to an embodiment of the present invention.

However, in the patent application publication described above, specific conditions that should be satisfied in order to increase the peel strength between the resin film and the metal layer after the weather resistance test are not considered.

The present invention has been made in view of the circumstances described above. An object of the present invention is to provide a substrate for a printed circuit board and a printed circuit board that have a high adhesive force between a metal layer and a resin film.

Advantageous Effects of Invention

A substrate for a printed circuit board according to an embodiment of the present invention has a high adhesive force between a metal layer and a resin film.

Description of Embodiments of the Present Invention

A substrate for a printed circuit board according to an embodiment of the present invention includes a resin film and a metal layer stacked on at least one of surfaces of the resin film. An average diffusion depth of a main metal of the metal layer in the resin film is 100 nm or less after a weather resistance test in which the substrate is held at 150° C. for seven days.

In the substrate for a printed circuit board, the average diffusion depth of the main metal of the metal layer in the resin film is 100 nm or less after the weather resistance test in which the substrate is held at 150° C. for seven days. Therefore, a decrease in the adhesive force between the metal layer and the resin film can be suppressed, and a state of high adhesive force can be maintained.

The average diffusion depth is preferably 80 nm or less before the weather resistance test. When the average diffusion depth is 80 nm or less before the weather resistance test, a decrease in the adhesive force between the metal layer and the resin film can be more reliably suppressed.

A maximum height Sz of a surface of the resin film exposed after removal of the metal layer by etching with an acidic solution, the maximum height Sz being specified in ISO25178, is preferably 0.05 µm or more and 1 µm or less. When the maximum height Sz of the surface of the resin film exposed after removal of the metal layer by etching with an acidic solution, the maximum height Sz being specified in ISO25178, is within the above range, the adhesive force between the metal layer and the resin film can be further improved without impairing circuit formability.

An arithmetical mean roughness Sa of a surface of the resin film exposed after removal of the metal layer by etching with an acidic solution, the arithmetical mean roughness Sa being specified in ISO25178, is preferably 0.01 µm or more and 0.2 µm or less. When the arithmetical mean roughness Sa of the surface of the resin film exposed after removal of the metal layer by etching with an acidic solution, the arithmetical mean roughness Sa being specified in ISO25178, is within the above range, the adhesive force between the metal layer and the resin film can be further improved without impairing circuit formability.

When a peeling test between the resin film and the metal layer is performed after the weather resistance test, the resin film preferably undergoes cohesive failure. When the peeling test between the resin film and the metal layer is performed after the weather resistance test and the resin film undergoes cohesive failure, a sufficiently high adhesive force between the metal layer and the resin film is ensured.

The resin film preferably contains a polyimide as a main component. When the resin film contains a polyimide as a main component, the resin film has sufficient insulation properties and mechanical strength.

The metal layer preferably contains copper as the main metal. When the metal layer contains copper as the main metal, the metal layer is relatively inexpensive and has good conductivity.

The metal layer preferably has a chromium content of 100 ppm by mass or less. When the chromium content of the metal layer is the upper limit or less, circuit formability due to etching of the metal layer improves.

The metal layer is preferably formed by application and heating of an ink containing a metal particle. When the metal layer is formed by application and heating of an ink containing a metal particle, a metal layer having a high adhesive force to the resin film can be formed at a relatively low cost.

A surface of the resin film, the surface having the metal layer thereon, is preferably treated with an alkali solution.

When the surface of the resin film, the surface having the metal layer thereon, is treated with an alkali solution, the surface of the resin film is modified to further improve the adhesiveness between the metal layer and the resin film.

The resin film preferably contains a component of the alkali solution. When the resin film contains a component of the alkali solution, for example, a metal element or a compound having a hydroxyl group, the metal element or the compound being derived from the alkali solution, can further improve the adhesiveness between the resin film and the metal layer.

A printed circuit board according to another embodiment of the present invention includes a conductive pattern, in which the conductive pattern is formed from the metal layer of the substrate for a printed circuit board.

Since the printed circuit board is formed by using the substrate for a printed circuit board, the printed circuit board has a relatively high adhesive force between the resin film and the conductive pattern formed from the metal layer.

Herein, the term "main metal" refers to a metal having the highest content by mass, preferably a metal contained in an amount of 50% by mass or more, and more preferably a metal contained in an amount of 80% by mass or more. The term "average diffusion depth" refers to, on a section of a substrate for a printed circuit board, an average depth of a region from an interface between a resin film and a metal layer, the region having a content of a main metal atom of the metal layer of 0.05 atomic % or more. The "content of an atom" can be measured by, for example, electron spectroscopy for chemical analysis (ESCA) or X-ray photoelectron spectroscopy (XPS), energy dispersive X-ray spectroscopy (EDX) or energy dispersive X-ray spectroscopy (EDS), electron probe micro analysis (EPMA), time of flight-secondary ion mass spectrometry (TOF-SIMS), secondary ion mass spectrometry (SIMS), or Auger electron spectroscopy (AES). In the case of electron spectroscopy for chemical analysis, measurement can be performed by scanning a surface using, as an X-ray source, the Kα radiation of an aluminum metal, with a beam diameter of 50 μm, and at an X-ray incident angle of 45° with respect to the surface to be analyzed. As a measuring apparatus, for example, a "Quantera" scanning X-ray photoelectron spectrometer available from ULVAC-PHI, Inc. can be used.

Details of Embodiments of the Present Invention

A substrate for a printed circuit board according to an embodiment of the present invention will now be described in detail below with reference to the drawings.

[Substrate for Printed Circuit Board]

A substrate 1 for a printed circuit board illustrated in FIG. 1 includes a resin film 2 and a metal layer 3 stacked on at least one of surfaces of the resin film 2.

The upper limit of the average diffusion depth of the main metal of the metal layer 3 in the resin film 2 after a weather resistance test in which the substrate 1 for a printed circuit board is held at 150° C. for seven days is 100 nm, preferably 80 nm, and more preferably 60 nm. The lower limit of the average diffusion depth of the main metal of the metal layer 3 in the resin film 2 after the weather resistance test is not particularly limited. When the average diffusion depth of the main metal of the metal layer 3 in the resin film 2 after the weather resistance test exceeds the upper limit, the content of the main metal of the metal layer 3 in a surface layer of the resin film 2 increases with time, and consequently adhesiveness between the resin film 2 and the metal layer 3 may become insufficient.

The upper limit of the average diffusion depth of the main metal of the metal layer 3 in the resin film 2 before the weather resistance test of the substrate 1 for a printed circuit board is preferably 80 nm, more preferably 40 nm, and still more preferably 20 nm. The lower limit of the average diffusion depth of the main metal of the metal layer 3 in the resin film 2 before the weather resistance test is not particularly limited. When the average diffusion depth of the main metal of the metal layer 3 in the resin film 2 before the weather resistance test exceeds the upper limit, the content of the main metal of the metal layer 3 in a surface layer of the resin film 2 increases with time, and consequently adhesiveness between the resin film 2 and the metal layer 3 may become insufficient.

When a peeling test between the resin film 2 and the metal layer 3 of the substrate 1 for a printed circuit board is performed after the weather resistance test, the resin film 2 preferably undergoes cohesive failure. The cohesive failure of the resin film 2 in the peeling test means that the peel strength between the resin film 2 and the metal layer 3 is higher than the strength of the resin film 2, and thus a sufficiently high adhesive force between the resin film 2 and the metal layer 3 is ensured.

The lower limit of the maximum height Sz of the surface of the resin film 2 exposed after removal of the metal layer 3 by etching with an acidic solution, the maximum height Sz being specified in ISO25178, is preferably 0.05 μm and more preferably 0.1 μm. The upper limit of the maximum height Sz of the surface of the resin film 2 after the removal of the metal layer 3 is preferably 1 μm and more preferably 0.5 μm. When the maximum height Sz of the surface of the resin film 2 after the removal of the metal layer 3 is less than the lower limit, adhesiveness between the resin film 2 and the metal layer 3 may become insufficient. In contrast, when the maximum height Sz of the surface of the resin film 2 after the removal of the metal layer 3 exceeds the upper limit, circuit formability may become insufficient in the formation of a circuit pattern by etching of the metal layer 3, and a circuit pattern having a desired accuracy may not be formed.

The lower limit of the arithmetical mean roughness Sa of the surface of the resin film 2 exposed after removal of the metal layer 3 by etching with an acidic solution, the arithmetical mean roughness Sa being specified in ISO25178, is preferably 0.01 µm and more preferably 0.05 µm. The upper limit of the arithmetical mean roughness Sa of the surface of the resin film 2 after the removal of the metal layer 3 is preferably 0.2 µm and more preferably 0.1 µm. When the arithmetical mean roughness Sa of the surface of the resin film 2 after the removal of the metal layer 3 is less than the lower limit, adhesiveness between the resin film 2 and the metal layer 3 may become insufficient. In contrast, when the arithmetical mean roughness Sa of the surface of the resin film 2 after the removal of the metal layer 3 exceeds the upper limit, circuit formability may become insufficient in the formation of a circuit pattern by etching of the metal layer 3, and a circuit pattern having a desired pattern accuracy may not be formed.

<Resin Film>

The resin film 2 includes a modified layer 4 on a surface having the metal layer thereon, the modified layer 4 having a composition different from another portion and improved adhesiveness to the metal layer 3.

Examples of the material that can be used for the resin film 2 include flexible resins such as polyimides, liquid crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, polytetrafluoroethylene, and glass base materials; and rigid-flexible materials which are composites of a hard material and a soft material. Of these, polyimides are particularly preferred because they exhibit high bonding strength to, for example, metal oxides and have good insulation properties and good mechanical strength.

The thickness of the resin film 2 is determined depending on a printed circuit board produced by using the substrate 1 for a printed circuit board and is not particularly limited. However, for example, the lower limit of the average thickness of the resin film 2 is preferably 5 µm and more preferably 12 µm. The upper limit of the average thickness of the resin film 2 is preferably 2 mm and more preferably 1.6 mm. When the average thickness of the resin film 2 is less than the lower limit, the resin film 2 and, by extension, the substrate 1 for a printed circuit board may have insufficient strength. In contrast, when the average thickness of the resin film 2 exceeds the upper limit, the substrate for a printed circuit board may have an unnecessarily large thickness.

(Modified Layer)

The modified layer 4 has a composition different from another portion of the resin film 2 and contains a metal, a metal ion, or a metal compound different from the main metal of the metal layer 3.

The expression "composition different from another portion" of the resin film 2 includes, for example, the case where the contents of elements are different as a result of substitution or addition of a functional group to the molecular chain of the resin, the case where a linear molecular chain is cut, and the case where a cyclic structure is opened. Although the reason for this is unclear, it is believed that the structural changes described as examples above increase the reactivity of the resin, to thereby improve the adhesiveness to the metal layer 3.

Since the modified layer 4 contains a metal, a metal ion, or a metal compound different from the main metal of the metal layer 3, the metal element of these (hereinafter, may be referred to as "different metal element") function to inhibit the diffusion of the main metal element of the metal layer 3 into the resin film 2. As a result, the average diffusion depth of the main metal of the metal layer 3 in the resin film 2 after the weather resistance test is decreased, and the substrate 1 for a printed circuit board can maintain a high adhesive force between the resin film 2 and the metal layer 3.

In the modified layer 4, preferably, the different metal element is chemically bonded to a component contained in the resin film 2. In the case where the different metal element is chemically bonded to the component contained in the resin film 2, the different metal is fixed into the resin film 2 to more effectively suppress the diffusion of the main metal of the metal layer 3 into the resin film 2. The chemical bond between the different metal element and the component contained in the resin film 2 can be identified by, for example, electron spectroscopy for chemical analysis (ESCA).

The modified layer 4 is preferably formed by a hydrophilic treatment and a metal introduction treatment.

Examples of the hydrophilic treatment that can be employed include a plasma treatment in which a surface is hydrophilized by irradiation with plasma, and an alkali treatment in which a surface is hydrophilized by using an alkali solution. An example of the metal introduction treatment that can be employed is a treatment for impregnating the resin film 2 with the different metal element or the like by immersing the resin film 2 in a solution containing the different metal element, a metal ion thereof, or a metal compound thereof. Of these, the alkali treatment is preferably employed as a method by which the hydrophilic treatment and the metal introduction treatment can be simultaneously performed at a low cost. In addition, in the case where the alkali treatment is employed as the hydrophilic treatment and the metal introduction treatment, as described above, the different metal can be relatively easily fixed into the resin film 2 by chemical bonding, and the diffusion of the main metal of the metal layer 3 into the resin film 2 can be more effectively suppressed. For example, in the case of the resin film 2 containing a polyimide as a main component, the different metal element can be chemically bonded and fixed to a carboxyl group formed by ring-opening of an imide ring in the alkali treatment.

The modified layer 4 formed by the alkali treatment preferably contains a component of the alkali solution other than the different metal element, for example, a compound having a hydroxyl group derived from the alkali solution. The component of the alkali solution may be present in a state in which the component is bonded to a resin or an additive contained in the resin film 2, and, for example, may be precipitated in the resin film 2 in the form of, for example, a metal hydroxide bonded to the different metal element. The component of the alkali solution present in the modified layer 4 can contribute to the hydrophilization and the fixation of the different metal element to improve the adhesiveness between the modified layer 4 and the metal layer 3.

In the case where the metal layer 3 is formed by application and heating of an ink containing metal particles as described below, the formation of the modified layer 4 by the hydrophilic treatment on the resin film 2 results in a low surface tension of the ink on the resin film 2, to thereby facilitate a uniform application of the ink to the resin film 2.

The different metal element contained in the modified layer 4 is not particularly limited but is preferably a metal that is ionized in an aqueous solution to generate ions so that the metal can be introduced into the modified layer 4 by using an aqueous solution of the metal.

The metal that is ionized in an aqueous solution is not particularly limited but is preferably an alkali metal or an alkaline-earth metal. Of these, potassium and sodium, which are inexpensive and easily ionized, are particularly preferred. In other words, when an alkali metal or an alkaline-earth metal is used as the different metal element, the different metal element can be relatively easily introduced into the modified layer 4 of the resin film 2, and in the weather resistance test, the diffusion of the main metal of the metal layer 3 into the resin film 2 can be effectively suppressed.

The lower limit of the content of the different metal element on a surface of the modified layer 4 is preferably 0.2 atomic %, more preferably 0.5 atomic %, and still more preferably 1 atomic %. The upper limit of the content of the different metal element on the surface of the modified layer 4 is preferably 10 atomic %, more preferably 9 atomic %, and still more preferably 5 atomic %. When the content of the different metal element on the surface of the modified layer 4 is less than the lower limit, the diffusion of the main metal of the metal layer 3 into the modified layer 4 may not be sufficiently suppressed. In contrast, when the content of the different metal element on the surface of the modified layer 4 exceeds the upper limit, the modified layer may have insufficient mechanical strength and easily undergoes cohesive failure, which may result in detachment of the metal layer 3.

<Metal Layer>

Figure 2:
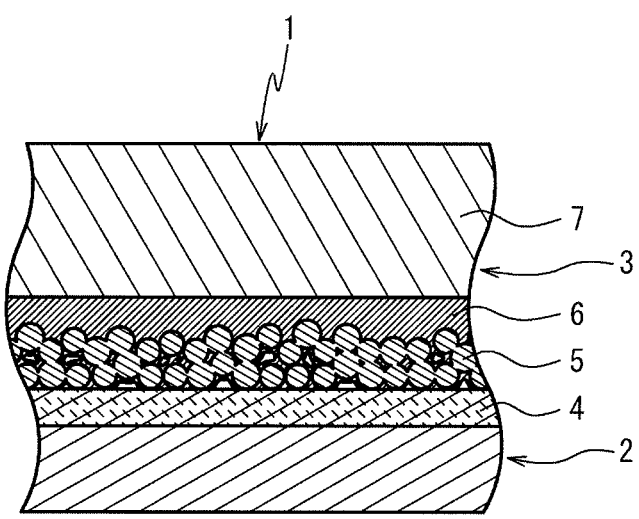
FIG. 2 is a schematic sectional view illustrating a detailed structural example of a substrate for a printed circuit board according to an embodiment of the present invention.

The metal layer 3 may have a single-layer structure. Alternatively, for example, as illustrated in FIG. 2, the metal layer 3 may have a structure including a first metal layer 5 stacked on a surface of the resin film 2 by sintering a plurality of metal particles, a second metal layer 6 stacked on a surface of the first metal layer 5 by electroless plating, and a third metal layer 7 stacked on a surface of the second metal layer 6 by electroplating.

The main metal of the metal layer 3 is preferably a metal such that a metal oxide derived from the metal or a group derived from the metal oxide and a metal hydroxide derived from the metal or a group derived from the metal hydroxide are generated in a portion of the first metal layer 5, the portion being located in the vicinity of the interface between the first metal layer 5 and the resin film 2. For example, copper (Cu), nickel (Ni), aluminum (Al), gold (Au), or silver (Ag) can be used. Of these, copper is suitably used as a metal that has good conductivity and good adhesiveness to the resin film 2, that is easily patterned by etching, and that is relatively inexpensive.

The metal layer 3 preferably has a sufficiently low content of a metal having poor etchability.

As a specific example, the upper limit of the chromium content of the metal layer 3 is preferably 100 ppm by mass and more preferably 50 ppm by mass. The lower limit of the chromium content of the metal layer 3 is not particularly limited. When the chromium content of the metal layer 3 exceeds the upper limit, circuit formability may become insufficient in the formation of a circuit pattern by etching of the metal layer 3, and a circuit pattern having a desired accuracy may not be formed.

(First Metal Layer)

The first metal layer 5 is formed so as to be stacked on one surface of the resin film 2 by application and heating of an ink on the surface of the modified layer 4, the ink containing a plurality of metal particles that contain, as a main component, a metal to be used as the main metal of the metal layer 3. The use of the ink containing metal particles enables the metal layer 3 to be formed on the one surface of the resin film 2 easily at a low cost.

The lower limit of the average particle size of the metal particles to be foil led into the first metal layer 5 is preferably 1 nm and more preferably 30 nm. The upper limit of the average particle size of the metal particles is preferably 500 nm and more preferably 100 nm. When the average particle size of the metal particles is less than the lower limit, for example, dispersibility and stability of the metal particles in the ink decrease, and consequently, uniform deposition of the metal particles on the surface of the resin film 2 may not be easily performed. In contrast, when the average particle size of the metal particles exceeds the upper limit, the size of gaps between the metal particles increases, and the porosity of the first metal layer 5 may not be easily reduced. Note that the term "average particle size" refers to a particle size at which the cumulative volume reaches 50% in a particle size distribution measured by a laser diffraction method.

The lower limit of the average thickness of the first metal layer 5 forming by application and heating of the ink containing the metal particles is preferably 50 nm and more preferably 100 nm. The upper limit of the average thickness of the first metal layer 5 is preferably 2 μm and more preferably 1.5 μm. When the average thickness of the first metal layer 5 is less than the lower limit, portions where the metal particles are not present in plan view are increased, and the conductivity may decrease. In contrast, when the average thickness of the first metal layer 5 exceeds the upper limit, it may become difficult to sufficiently reduce the porosity of the first metal layer 5, and the metal layer 3 may have an unnecessarily large thickness. The lower limit of the average thickness of the first metal layer 5 formed by sputtering is preferably 1 nm. The upper limit of the average thickness of the first metal layer 5 formed by sputtering is preferably 1,000 nm.

(Second Metal Layer)

The second metal layer 6 is formed by subjecting the outer surface of the first metal layer 5 to electroless plating to deposit the same metal as the main metal of the metal particles that form the first metal layer 5. The second metal layer 6 is formed so as to be impregnated into the first metal layer 5. Specifically, the gaps between the metal particles that form the first metal layer 5 are filled with the main metal by electroless plating to reduce pores in the first metal layer 5. By filling the gaps between the metal particles with the electroless-plating metal, the pores between the metal particles are reduced, and it is possible to suppress the peeling of the first metal layer 5 from the resin film 2, the peeling starting from breaking at such pores.

In some cases, the second metal layer 6 is formed only inside the first metal layer 5 depending on electroless plating conditions. In general, the lower limit of the average thickness of the second metal layer 6 (excluding the thickness of the plated metal inside the first metal layer 5) formed on the outer surface of the first metal layer 5 is preferably 0.2 pun and more preferably 0.3 μm. The upper limit of the average thickness of the second metal layer 6 formed on the outer surface of the first metal layer 5 is preferably 1 μm and more preferably 0.7 μm. When the average thickness of the second metal layer 6 formed on the outer surface of the first metal layer 5 is less than the lower limit, the gaps between the metal particles of the first metal layer 5 are not sufficiently filled with the second metal layer 6, and the porosity cannot be sufficiently reduced, which may result in an insufficient peel strength between the resin film 2 and the metal layer 3. In contrast, when the average thickness of the second metal layer 6 formed on the outer surface of the first metal layer 5 exceeds the upper limit, the time required to perform electroless plating may be increased, and the production cost may unnecessarily increase.

(Third Metal Layer)

The third metal layer 7 is formed by subjecting the outer surface side of the first metal layer 5, that is, the outer surface of the second metal layer 6 to electroplating to further deposit the main metal. The thickness of the metal layer 3 can be easily and accurately adjusted by the third metal layer 7. In addition, the use of electroplating enables the thickness of the metal layer 3 to be increased in a short time.

The thickness of the third metal layer 7 is determined depending on the type and thickness of a conductive pattern necessary for a printed circuit board formed by using the substrate 1 for a printed circuit board and is not particularly limited. In general, the lower limit of the average thickness of the third metal layer 7 is preferably 1 µm and more preferably 2 µm. The upper limit of the average thickness of the third metal layer 7 is preferably 100 µm and more preferably 50 µm. When the average thickness of the third metal layer 7 is less than the lower limit, the metal layer 3 may be easily damaged. In contrast, when the average thickness of the third metal layer 7 exceeds the upper limit, the substrate 1 for a printed circuit board may have an unnecessarily large thickness, and the substrate 1 for a printed circuit board may have insufficient flexibility.

[Advantages]

In the substrate 1 for a printed circuit board, as described above, the average diffusion depth of the main metal of the metal layer 3 in the resin film 2 is 100 nm or less after a weather resistance test in which the substrate 1 for a printed circuit board is held at 150° C. for seven days. Therefore, a decrease in the adhesive force between the resin film 2 and the metal layer 3 is suppressed, and the substrate 1 for a printed circuit board can maintain a high adhesive force.

[Method for Producing Substrate for Printed Circuit Board]

The substrate 1 for a printed circuit board can be produced by a method including a step of forming a modified layer 4 on a surface of a resin film 2 by using an alkali solution containing metal ions, the modified layer 4 having a composition different from another portion, a step of rinsing, with water, the resin film 2 after the modified layer formation step, and a step of stacking a metal layer containing, as a main component, a metal different from the metal ions in the alkali solution on the resin film 2 after the rinse step.

<Modified Layer Formation Step>

In the modified layer formation step, at least one of surfaces of a resin film 2 is brought into contact with an alkali solution by, for example, immersion to form a modified layer 4.

As the alkali solution used in the modified layer formation step, an aqueous alkaline solution containing ions of a different metal element to be introduced into the resin film 2 can be used. Examples of the aqueous alkaline solution containing ions of the different metal element include aqueous solutions of sodium hydroxide and aqueous solutions of potassium hydroxide.

The alkali solution used in the modified layer formation step may have a pH of, for example, 12 or more and 15 or less. The contact time of the resin film 2 with the alkali solution may be, for example, 15 seconds or more and 10 minutes or less. The temperature of the alkali solution may be, for example, 10° C. or higher and 70° C. or lower.

<Rinse Step>

In the rinse step, although the resin film 2 is rinsed with water to remove the alkali solution adhering to the surfaces of the resin film 2, the ions of the different metal element are left in the modified layer 4. In the rinse step, a component, such as a hydroxide ion, other than the ions of the different metal element in the alkali solution is preferably left in the modified layer 4.

In the rinse step, when rinsing is performed by immersion in a water bath, the lower limit of the rinse time is preferably 3 seconds and more preferably 5 seconds. The upper limit of the rinse time is preferably 180 seconds, more preferably 100 seconds, and still more preferably 50 seconds. When the rinse time is less than the lower limit, the alkali solution on the surfaces of the resin film 2 may not be sufficiently removed. In contrast, when the rinse time exceeds the upper limit, the different metal element may not be left in the modified layer 4, and thus the effect of suppressing the diffusion of the main metal of the metal layer 3 into the resin film 2 may become insufficient.

In the case where the surface of the resin film 2 after the rinse step is analyzed by electron spectroscopy for chemical analysis, the lower limit of the content of the different metal element is preferably 1 atomic % and more preferably 2 atomic %. The upper limit of the content of the different metal element on the surface of the resin film 2 after the rinse step is preferably 10 atomic % and more preferably 9 atomic %. When the content of the different metal element on the surface of the resin film 2 after the rinse step is less than the lower limit, in a metal layer-stacking step described below, the different metal element diffuses or flows out, and the amount of the different metal element further decreases. As a result, the diffusion of the main metal of the metal layer 3 into the modified layer 4 may not be sufficiently suppressed. In contrast, when the content of the different metal element on the surface of the resin film 2 after the rinse step exceeds the upper limit, the modified layer 4 may have insufficient mechanical strength.

In the rinse step, preferably, the rinse water is sufficiently dried. By evaporating water in the resin film 2, the ions of the different metal element are stabilized by precipitation in the form of a metal or a metal hydroxide or by bonding to, for example, a resin component of the resin film 2.

<Metal Layer-Stacking Step>

The metal layer-stacking step includes a step of forming a first metal layer 5 by application and heating of an ink containing a plurality of metal particles, a step of forming a second metal layer 6 by electroless plating, and a step of forming a third metal layer 7 by electroplating.

(First Metal Layer Formation Step)

As the ink used in the first metal layer formation step, an ink containing a dispersion medium for metal particles and a dispersant for uniformly dispersing the metal particles in the dispersion medium is suitably used. Use of the ink in which the metal particles are uniformly dispersed enables the metal particles to be uniformly adhered to the surface of the resin film 2 to form the uniform first metal layer 5 on the surface of the resin film 2.

The metal particles contained in the ink can be produced by, for example, a high-temperature treatment method, a liquid-phase reduction method, or a gas-phase method. Metal particles produced by the liquid-phase reduction method, by which particles having a uniform particle size can be produced at a relatively low cost, are preferably used.

The dispersant contained in the ink is not particularly limited. However, a polymer dispersant having a molecular weight of 2,000 or more and 300,000 or less is preferably used. By using such a polymer dispersant having a molecular weight within the above range, the metal particles can be satisfactorily dispersed in the dispersion medium, and the dense, defect-free first metal layer 5 can be obtained. When the molecular weight of the dispersant is less than the lower limit, the effect of preventing the aggregation of the metal particles to maintain the dispersion may not be sufficiently achieved. As a result, the first metal layer 5 stacked on the resin film 2 may not be a layer that is dense and has few defects. In contrast, when the molecular weight of the dispersant exceeds the upper limit, the dispersant is excessively bulky, and therefore, the dispersant may inhibit sintering of the metal particles and may cause the formation of voids during heating after the application of the ink. When the dispersant is excessively bulky, the degree of denseness of the first metal layer 5 may decrease, and the decomposition residues of the dispersant may decrease the conductivity.

Preferably, the dispersant does not contain sulfur, phosphorus, boron, a halogen, or an alkali from the viewpoint of preventing the degradation of components. Preferred examples of the dispersant include amine-based polymer dispersants, such as polyethyleneimine and polyvinylpyrrolidone; hydrocarbon-based polymer dispersants each having a carboxylic acid group in the molecule thereof, such as polyacrylic acid and carboxymethyl cellulose; and polymer dispersants each having a polar group, such as Poval (polyvinyl alcohol), styrene-maleic acid copolymers, olefin-maleic acid copolymers, and copolymers each having a polyethyleneimine moiety and a polyethylene oxide moiety in one molecule thereof, all of these dispersants each having a molecular weight within the range described above.

The dispersant may be added to the reaction system in the form of a solution in which the dispersant is dissolved in water or a water-soluble organic solvent. The content of the dispersant is preferably 1 part by mass or more and 60 parts by mass or less per 100 parts by mass of the metal particles. The dispersant surrounds the metal particles to prevent aggregation of the metal particles, thus satisfactorily dispersing the metal particles. When the content of the dispersant is less than the lower limit, the effect of preventing the aggregation may become insufficient. In contrast, when the content of the dispersant exceeds the upper limit, in the heating step after the application of the ink, an excessive amount of the dispersant may inhibit the sintering of the metal particles and may cause the formation of voids, and decomposition residues of the polymer dispersant may remain as impurities in the first metal layer 5 and decrease the conductivity.

The content of water serving as the dispersion medium in the ink is preferably 20 parts by mass or more and 1,900 parts by mass or less per 100 parts by mass of the metal particles. Water serving as the dispersion medium sufficiently swells the dispersant to satisfactorily disperse the metal particles surrounded by the dispersant. When the content of water is less than the lower limit, the effect of swelling the dispersant, the effect being achieved by water, may become insufficient. In contrast, when the content of water exceeds the upper limit, the proportion of the metal particles in the ink is decreased, and thus the satisfactory first metal layer 5 having a necessary thickness and a necessary density may not be formed on the surface of the resin film 2.

Various water-soluble organic solvents can be used as an organic solvent that is optionally mixed with the ink. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of a polyhydric alcohol such as ethylene glycol or glycerin or another compound; and glycol ethers such as ethylene glycol monoethyl ether and diethylene glycol monobutyl ether.

The content of the water-soluble organic solvent is preferably 30 parts by mass or more and 900 parts by mass or less per 100 parts by mass of the metal particles. When the content of the water-soluble organic solvent is less than the lower limit, the effect of adjusting the viscosity and the vapor pressure of the dispersion, the effect being achieved by the organic solvent, may not be sufficiently provided. In contrast, when the content of the water-soluble organic solvent exceeds the upper limit, the effect of swelling the dispersant with water may become insufficient, which may result in the aggregation of the metal particles in the ink.

As a method for applying the ink to the resin film 2, a known coating method such as a spin coating method, a spray coating method, a bar coating method, a die coating method, a slit coating method, a roll coating method, or a dip coating method can be employed. Alternatively, the ink may be applied to only a part of a surface of the resin film 2 by screen printing or with a dispenser or the like.

The resulting coating of the ink formed by applying the ink to the resin film 2 is heated. As a result, the solvent and the dispersant in the ink are evaporated or thermally decomposed, and the remaining metal particles are sintered to form the first metal layer 5 on one surface of the resin film 2. The coating of the ink is preferably dried prior to the heating.

The sintering is preferably performed in an atmosphere containing a certain amount of oxygen. The lower limit of the oxygen concentration in the atmosphere during the sintering is preferably 1 ppm by volume and more preferably 10 ppm by volume. The upper limit of the oxygen concentration is preferably 10,000 ppm by volume and more preferably 1,000 ppm by volume. When the oxygen concentration is less than the lower limit, the amount of a metal oxide generated in a portion of the first metal layer 5, the portion being located in the vicinity of the interface between the first metal layer 5 and the resin film 2, is small, and the adhesive force between the resin film 2 and the first metal layer 5 may not be sufficiently improved. In contrast, when the oxygen concentration exceeds the upper limit, the metal particles may be excessively oxidized, resulting in a decrease in the conductivity of the first metal layer 5.

The lower limit of the sintering temperature is preferably 150° C. and more preferably 200° C. The upper limit of the sintering temperature is preferably 500° C. and more preferably 400° C. When the sintering temperature is lower than the lower limit, the metal particles cannot be connected together, and thus the first metal layer 5 may collapse during the subsequent formation of the second metal layer 6. In contrast, when the sintering temperature exceeds the upper limit, the resin film 2 may be deformed.

(Second Metal Layer Formation Step)

In the second metal layer formation step, one surface of the first metal layer 5 stacked on the one surface of the resin film 2 in the first metal layer formation step is subjected to electroless plating to form a second metal layer 6.

The electroless plating is preferably performed together with treatments such as a cleaner step, a rinse step, an acid treatment step, a rinse step, a pre-dip step, an activator step, a rinse step, a reduction step, and a rinse step.

After the second metal layer 6 is formed by electroless plating, preferably, a heat treatment is further performed. By performing the heat treatment after the formation of the second metal layer 6, the amount of the metal oxide or the like in the portion of the first metal layer 5, the portion being located in the vicinity of the interface between the first metal layer 5 and the resin film 2, is further increased, to further increase the adhesive force between the resin film 2 and the first metal layer 5. The temperature and the oxygen concentration during the heat treatment after electroless plating may be the same as the heating temperature and the oxygen concentration in the first metal layer formation step.

(Third Metal Layer Formation Step)

In the third metal layer formation step, a third metal layer 7 is stacked on the outer surface of the second metal layer 6 by electroplating. The entire thickness of the metal layer 3 is increased to a desired thickness in the third metal layer formation step.

The electroplating can be performed by using a known electroplating bath corresponding to a plating metal such as copper, nickel, or silver and selecting appropriate conditions such that the metal layer 3 having a desired thickness is rapidly formed without any defect.

[Advantages]

In the method for producing a substrate for a printed circuit board, the alkali treatment improves the adhesiveness of the surface of the resin film 2 to the metal layer 3 and enables a different metal element that suppresses the diffusion of the main metal of the metal layer 3 into the resin film 2 after a weather resistance test to be introduced in the resin film 2.

Therefore, in the method for producing a substrate for a printed circuit board, since the average diffusion depth of the main metal of the metal layer 3 in the resin film 2 is 100 nm or less after the weather resistance test, it is possible to produce the substrate 1 for a printed circuit board at a relatively low cost, the substrate 1 having a good adhesive force between the metal layer 3 and the resin film 2.

In the method for producing a substrate for a printed circuit board, the ions of the different metal element in the alkali solution are left in the modified layer 4 in the rinse step, to thereby suppress the dispersion of the main metal of the metal layer 3 in the modified layer 4. Therefore, according to the method for producing a substrate for a printed circuit board, it is possible to produce a substrate for a printed circuit board at a relatively low cost, the substrate having a high adhesive force between the metal layer 3 and the resin film 2, the adhesive force being unlikely to decrease.

[Printed Circuit Board]

The printed circuit board is formed from the substrate 1 for a printed circuit board by a subtractive method or a semi-additive method. More specifically, the printed circuit board is produced by forming a conductive pattern using the subtractive method or semi-additive method in which the metal layer 3 of the substrate 1 for a printed circuit board is used.

In the subtractive method, a film of a photosensitive resist is formed on one of surfaces of the substrate 1 for a printed circuit board so as to cover the surface. The resist is patterned by exposure, development, and other processes to form a pattern corresponding to a conductive pattern. Subsequently, a portion of the metal layer 3 other than the conductive pattern is removed by etching using the patterned resist as a mask. Lastly, the remaining resist is removed, thus producing the printed circuit board having the conductive pattern which is formed of the remaining portion of the metal layer 3 of the substrate 1 for a printed circuit board.

In the semi-additive method, a film of a photosensitive resist is formed on one of surfaces of the substrate 1 for a printed circuit board so as to cover the surface. The resist is patterned by exposure, development, and other processes to form an opening corresponding to a conductive pattern. Subsequently, plating is performed by using the resist as a mask so that a conductive layer is selectively stacked by using, as a seed layer, the metal layer 3 exposed in the opening portion of the mask. Subsequently, the resist is removed, and a surface of the conductive layer and a portion of the metal layer 3 where the conductive layer is not formed are then removed by etching, thus producing the printed circuit board having the conductive pattern in which a conductive layer is further stacked on the remaining portion of the metal layer 3 of the substrate 1 for a printed circuit board.

In the printed circuit board, the upper limit of the content of the different metal element, which is different from the main metal of the metal layer 3, on the surface of the modified layer 4 exposed at the conductive pattern is preferably 1.5 atomic %, more preferably 1.0 atomic %, and still more preferably 0.5 atomic %. The lower limit of the content of the different metal element on the surface of the modified layer 4 exposed at the conductive pattern is not particularly limited. When the content of the different metal element on the surface of the modified layer 4 exposed at the conductive pattern exceeds the upper limit, a short-circuit may be caused by the migration of the metal element when the printed circuit board is used.

[Advantages]

The printed circuit board is produced by using the substrate 1 for a printed circuit board. Therefore, the printed circuit board has a high adhesive force between the resin film 2 and the metal layer 3, and the conductive pattern is unlikely to be peeled off.

Since the printed circuit board is formed by using the substrate 1 for a printed circuit board by a common subtractive method or semi-additive method, the printed circuit board can be produced at a relatively low cost.

Other Embodiments

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and the scope of equivalents of the claims.

The metal layer may be stacked on each surface of the resin film of the substrate for a printed circuit board.

The resin film of the substrate for a printed circuit board need not necessarily have a modified layer thereon.

In the substrate for a printed circuit board, the metal layer may not have a multilayer structure. One or two layers of the first metal layer, the second metal layer, and the third metal layer may be omitted. In the substrate for a printed circuit board, another overlying metal layer may be provided on the surface of the metal layer. For example, in the embodiment described above, the third metal layer may be formed of a metal different from the main metal. In this case, the third metal layer is regarded as the overlying metal layer. In other words, the main metal of the metal layer in the present invention refers to the main metal of the metal layer in contact with the resin film.

The first metal layer of the substrate for a printed circuit board may be formed by a method other than the application and heating of the ink containing metal particles. Examples of a method for forming a metal layer without using an ink include thermocompression bonding of metal foil, deposition of a metal only by electroless plating and electroplating, vapor deposition of a metal, and sputtering of a metal. The second metal layer may be formed by a method other than electroless plating. The third metal layer may be formed by a method other than electroplating.

In the method for producing the substrate for a printed circuit board, before or after the modified layer formation step, a step of adjusting the maximum height Sz and the arithmetical mean roughness Sa of the resin film, for example, sandblasting, wet blasting, or the like, may be performed.

Examples

The present invention will now be described in detail by way of Examples. The present invention is not interpreted in a limited manner on the basis of the description of the Examples.

Prototype Nos. 1 to 11 of substrates for printed circuit boards, each of the substrates being prepared by forming a modified layer on a surface of a resin film and subsequently stacking a metal layer, were obtained on the basis of the following procedures. With regard to each of the substrate Nos. 1 to 11 for printed circuit boards, the maximum height Sz and the arithmetical mean roughness Sa of the surface of the resin film exposed after removal of the metal layer by etching, the maximum height Sz and the arithmetical mean roughness Sa being specified in ISO25178, the diffusion depth of a main metal of the metal layer on a section, a peel strength between the metal layer and the resin film (index of adhesive force), the content of a different metal element on a surface of the modified layer (amount of metal), and a minimum width of a pattern capable of being formed by etching the metal layer were measured. In addition, each of the substrate Nos. 1 to 11 for printed circuit boards was subjected to a weather resistance test in which the substrate was held at 150° C. for seven days. After this weather resistance test, the diffusion depth of the main metal of the metal layer on a section and the peel strength between the metal layer and the resin film were again measured.

(Substrate No. 1 for Printed Circuit Board)

As a resin film, a polyimide sheet "APICAL NPI" (average thickness: 25 μm) available from Kaneka Corporation was used. The resin film was immersed in a 2.5 mol/L aqueous solution of sodium hydroxide (pH: about 14) at 40° C. for 30 seconds to form a modified layer. Subsequently, the resin film was rinsed with water by being immersed in a water bath for 9 seconds and then dried. A metal layer was formed as follows. First, a copper nanoink (an ink containing 26% by mass of copper particles having a particle size of 80 nm) was applied to a surface of the modified layer, dried, and fired at 350° C. for 2 hours in a nitrogen atmosphere to form a first metal layer having an average thickness of 150 nm. Next, copper was deposited by electroless copper plating such that the average total thickness became 0.5 μm. The resulting copper film was fired at 350° C. for 2 hours in a nitrogen atmosphere to form a second metal layer. Furthermore, copper was deposited by electrolytic copper plating to form a third metal layer. Thus, a metal layer having an average total thickness of 20 μm was formed to prepare a substrate No. 1 for a printed circuit board.

(Substrate No. 2 for Printed Circuit Board)

A substrate No. 2 for a printed circuit board was prepared as in the substrate No. 1 for a printed circuit board except that the immersion time in the alkali solution was 90 seconds.

(Substrate No. 3 for Printed Circuit Board)

On a surface of a modified layer formed on a resin film as in the substrate No. 2 for a printed circuit board, copper was deposited by sputtering to form a first metal layer having an average thickness of 10 nm, and copper was then deposited by electrolytic copper plating to form a third metal layer. Thus, a metal layer having an average total thickness of 20 μm was formed to prepare a substrate No. 3 for a printed circuit board. Regarding the sputtering conditions, the sputtering was conducted by using a vacuum sputtering apparatus at an ultimate degree of vacuum of $0.8 \times 10^{-4}$ Pa, at a sputtering pressure of 0.1 Pa, and at an electric power of 13 kW.

(Substrate No. 4 for Printed Circuit Board)

A substrate No. 4 for a printed circuit board was prepared as in the substrate No. 2 for a printed circuit board except that the rinse time was 60 seconds.

(Substrate No. 5 for Printed Circuit Board)

A substrate No. 5 for a printed circuit board was prepared as in the substrate No. 2 for a printed circuit board except that the rinse time was 150 seconds.

(Substrate No. 6 for Printed Circuit Board)

A substrate No. 6 for a printed circuit board was prepared as in the substrate No. 3 for a printed circuit board except that the rinse time was 150 seconds.

(Substrate No. 7 for Printed Circuit Board)

A substrate No. 7 for a printed circuit board was prepared as in the substrate No. 1 for a printed circuit board except that, prior to the alkali treatment, a surface of a resin film was subjected to wet blasting (WB). In the wet blasting, an abrasive slurry containing alumina as an abrasive was blasted at a pressure of 0.2 Pa for 30 seconds.

(Substrate No. 8 for Printed Circuit Board)

A substrate No. 8 for a printed circuit board was prepared as in the substrate No. 7 for a printed circuit board except that wet blasting was conducted at a pressure of 0.3 Pa for 60 seconds.

(Substrate No. 9 for Printed Circuit Board)

A substrate No. 9 for a printed circuit board was prepared as in the substrate No. 3 for a printed circuit board except that, prior to the alkali treatment, a surface of a resin film was subjected to wet blasting (WB), and the immersion time in the alkali solution was 30 seconds. The wet blasting was conducted at a pressure of 0.3 Pa for 60 seconds as in the substrate No. 8 for a printed circuit board.

(Substrate No. 10 for Printed Circuit Board)

A substrate No. 10 for a printed circuit board was prepared as in the substrate No. 2 for a printed circuit board except that the rinse time was 210 seconds.

(Substrate No. 11 for Printed Circuit Board)

A surface of a resin film that is the same as the resin film used in the substrate No. 1 for a printed circuit board was subjected to sandblasting in which an alumina powder was blasted at a pressure of 0.2 Pa for 30 seconds. A metal layer was stacked on the sand-blasted surface as in the substrate No. 1 for a printed circuit board to prepare a substrate No. 11 for a printed circuit board.

(Maximum Height Sz)

The maximum height Sz was measured in a square region having a side length of 20 μm in accordance with ISO25178 by using a laser microscope "VK-X" available from Keyence Corporation.

(Arithmetical Mean Roughness Sa)

The arithmetical mean roughness Sa was measured in a square region having a side length of 20 μm in accordance with ISO25178 by using a laser microscope "VK-X" available from Keyence Corporation.

(Diffusion Depth)

The diffusion depth was determined as follows. The content of copper element on a section of a substrate for a printed circuit board was determined by mapping with a "Quantera" scanning X-ray photoelectron spectrometer available from ULVAC-PHI, Inc. by using, as an X-ray source, the Kα radiation of an aluminum metal with a beam diameter of 50 μm and at an X-ray incident angle of 45° with respect to the surface to be analyzed. From the resulting mapping image, the average of the depth of a region from the interface between the resin film and the metal layer, the region containing 0.05 atomic % or more of copper element in the resin film, was calculated.

(Peel Strength)

The peel strength was measured by a method in accordance with JIS-K-6854-2 (1999) "Adhesives-Determination of peel strength of bonded assemblies-Part 2: 180° peel" under the assumption that the resin film was regarded as a flexible adherend.

(Pattern Minimum Width)

The minimum width of a pattern that can be formed was determined as follows. A plurality of conductive patterns were formed by etching the metal layer, the conductive patterns each having a stripe shape in which a line width and a space width (a gap between the lines) are equal to each other and having different line widths and space widths. As a result of observation of the formed conductive patterns with a SEM, the lower limit of the line width and the space width (L/S) at which a clear pattern could be formed was defined as the pattern minimum width.

Table 1 below summarizes the preparation conditions for the prototypes of the substrates for printed circuit boards and the results of the measurements.

TABLE 1

| | Modification treatment | Rinse time [sec] | Method for forming metal layer | Maximum height Sz [μm] | Arithmetical mean roughness Sa [μm] | Peel strength before weather resistance test [N/cm] | Diffusion depth before weather resistance test [nm] | Amount of metal on modified layer surface [atomic %] | Peel strength after weather resistance test [N/cm] | Diffusion depth after weather resistance test [nm] | Pattern minimum width (L/S) [μm] |
|---|---|---|---|---|---|---|---|---|---|---|---|
| No. 1 | Alkali 30 sec | 9 | Copper nanoink | 0.286 | 0.038 | 9.8 | 8 | 1.0 | 7.0 | 51 | 10/10 |
| No. 2 | Alkali 90 sec | 9 | Copper nanoink | 0.268 | 0.031 | 10.8 | 5 | 1.2 | 7.4 | 48 | 10/10 |
| No. 3 | Alkali 90 sec | 9 | Copper sputtering | 0.268 | 0.031 | 9.1 | 9 | 4.6 | 7.8 | 28 | 10/10 |
| No. 4 | Alkali 90 sec | 60 | Copper nanoink | 0.248 | 0.025 | 9.2 | 16 | 0.8 | 6.6 | 60 | 10/10 |
| No. 5 | Alkali 90 sec | 150 | Copper nanoink | 0.291 | 0.039 | 8.6 | 62 | 0.4 | 4.1 | 94 | 10/10 |
| No. 6 | Alkali 90 sec | 150 | Copper sputtering | 0.291 | 0.039 | 8.3 | 48 | 1.0 | 4.8 | 71 | 10/10 |
| No. 7 | WB (0.2 Pa · 30 sec) Alkali 30 sec | 9 | Copper nanoink | 0.337 | 0.040 | 11.8 | 12 | 1.2 | 7.6 | 57 | 10/10 |
| No. 8 | WB (0.3 Pa · 60 sec) Alkali 30 sec | 9 | Copper nanoink | 0.917 | 0.172 | 12.2 | 28 | 0.3 | 8.2 | 78 | 10/10 |
| No. 9 | WB (0.3 Pa · 60 sec) Alkali 30 sec | 9 | Copper sputtering | 0.917 | 0.172 | 11.6 | 36 | 1.4 | 8.1 | 84 | 10/10 |
| No. 10 | Alkali 90 sec | 210 | Copper nanoink | 0.255 | 0.028 | 7.3 | 108 | 0.0 | 1.2 | 128 | 20/20 |
| No. 11 | Sand-blasting | — | Copper nanoink | 3.432 | 0.411 | 14.2 | 214 | 0.0 | 7.8 | 256 | 30/30 |

The results showed that a small diffusion depth of copper in the resin film after the weather resistance test provided a substrate for a printed circuit board, the substrate having adhesiveness between the resin film and the metal layer that was not significantly decreased by the weather resistance test. The results also showed that a small maximum height Sz and a small arithmetical mean roughness Sa provided a substrate for a printed circuit board, the substrate having good circuit formability.

REFERENCE SIGNS LIST 1 substrate for printed circuit board
2 resin film
3 metal layer
4 modified layer
5 first metal layer
6 second metal layer
7 third metal layer

The invention claimed is:

1. A substrate for a printed circuit board, the substrate comprising a resin film and a metal layer stacked on at least one of surfaces of the resin film,
wherein an average diffusion depth of a main metal of the metal layer in the resin film is 100 nm or less after a weather resistance test in which the substrate is held at 150° C. for seven days, wherein the main metal of the metal layer is copper, and
wherein the resin film includes a modified layer on a surface having the metal layer thereon, and the modified layer contains an alkali metal or an alkaline-earth metal having a content from 0.2 atomic % to 10 atomic % inclusive on a surface of the modified layer,
wherein the average diffusion depth refers to, on a section of the substrate for a printed circuit board, an average depth of a region from an interface between the resin film and the metal layer, the region having a content of the main metal atom of the metal layer of 0.05 atomic % or more.

2. The substrate for a printed circuit board according to claim 1, wherein the average diffusion depth is 80 nm or less before the weather resistance test.

3. The substrate for a printed circuit board according to claim 1, wherein a maximum height Sz of a surface of the resin film exposed after removal of the metal layer by etching with an acidic solution, the maximum height Sz being specified in ISO25178, is from 0.05 μm to 1 μm inclusive.

4. The substrate for a printed circuit board according to claim 1, wherein an arithmetical mean roughness Sa of a surface of the resin film exposed after removal of the metal layer by etching with an acidic solution, the arithmetical mean roughness Sa being specified in ISO25178, is from 0.01 μm to 0.2 μm inclusive.

5. The substrate for a printed circuit board according to claim 1, wherein when a peeling test between the resin film and the metal layer is performed after the weather resistance test, the resin film undergoes cohesive failure.

6. The substrate for a printed circuit board according to claim 1, wherein the resin film contains a polyimide as a main component.

7. The substrate for a printed circuit board according to claim 1, wherein the metal layer has a chromium content of 100 ppm by mass or less.

8. The substrate for a printed circuit board according to claim 1, wherein the metal layer is formed by application and heating of an ink containing a metal particle.

9. The substrate for a printed circuit board according to claim 1, wherein a surface of the resin film, the surface having the metal layer thereon, is treated with an alkali solution.

10. The substrate for a printed circuit board according to claim 9, wherein the resin film contains a component of the alkali solution.

11. A printed circuit board comprising a conductive pattern, wherein the conductive pattern is formed from the metal layer of the substrate for a printed circuit board according to claim 1.

12. The substrate for a printed circuit board according to claim 1,
wherein the resin film contains a polyimide as a main component, and
the alkali metal or alkaline-earth metal on the surface of the modified layer is chemically bonded and fixed to a carboxyl group formed by ring-opening of an imide ring in the polyimide.

13. The substrate for a printed circuit board according to claim 1,
wherein the modified layer contains a metal hydroxide bonded to the alkali metal or alkaline-earth metal.

14. The substrate for a printed circuit board according to claim 1,
wherein a metal oxide derived from the main metal or a group derived from the metal oxide and a metal hydroxide derived from the main metal or a group derived from the metal hydroxide are present in a portion located in a vicinity of an interface between the metal layer and the resin film.

* * * * *